United States Patent [19]

Grindel et al.

[11] Patent Number: 4,570,130

[45] Date of Patent: Feb. 11, 1986

[54] INPUT CONTROLLER CIRCUIT APPARATUS FOR PHASE LOCK LOOP VOLTAGE CONTROLLED OSCILLATOR

[75] Inventors: David R. Grindel, Apalachin; Gary A. Trudgen, Endwell, both of N.Y.

[73] Assignee: International Business Machines Corporation, Armonk, N.Y.

[21] Appl. No.: 435,536

[22] Filed: Oct. 20, 1982

[51] Int. Cl.[4] .............................................. H03K 3/03
[52] U.S. Cl. ........................................ 331/8; 331/17; 331/108 D; 331/177 R
[58] Field of Search ................... 331/8, 16, 17, 25, 27, 331/108 D, 177 R

[56] References Cited

U.S. PATENT DOCUMENTS

| | | | |
|---|---|---|---|
| 3,437,958 | 4/1969 | Shaw et al. | 332/16 |
| 3,611,194 | 10/1971 | Codd et al. | 331/108 R |
| 3,851,276 | 11/1974 | Kaplan | 331/108 D |
| 3,857,110 | 12/1974 | Grebene | 331/108 D |
| 3,870,971 | 3/1975 | Takahashi et al. | 331/108 D |
| 3,904,988 | 11/1975 | Hsiao | 331/111 |
| 4,007,429 | 2/1977 | Cadalora et al. | 331/17 |
| 4,028,638 | 6/1977 | Towle | 331/109 |
| 4,061,987 | 12/1977 | Nagahama | 331/111 |
| 4,272,728 | 6/1981 | Wittlinger | 330/253 |
| 4,275,653 | 6/1981 | Bolcavage et al. | 101/93.14 |
| 4,287,461 | 9/1981 | Promis et al. | 318/571 |
| 4,319,200 | 3/1982 | Terwilliger | 331/8 |
| 4,332,461 | 6/1982 | Cail et al. | 355/14 R |
| 4,360,788 | 11/1982 | Erps et al. | 331/1 A |
| 4,360,926 | 11/1982 | Hedin et al. | 375/120 |
| 4,425,844 | 1/1984 | Carrington et al. | 101/93.14 |
| 4,494,080 | 1/1985 | Call | 331/8 |

FOREIGN PATENT DOCUMENTS 2089602 6/1982 United Kingdom .

OTHER PUBLICATIONS

"Voltage Controlled Oscillator"–D. F. Cox, IBM Technical Disclosure Bulletin, vol. 13, No. 8, Jan. 1971, pp. 2170–2171.
"Auto-Reference Phase-Locked-Loop Clock Generator"–R. M. Wooton, IBM Technical Disclosure Bulletin, vol. 24, No. 5, Oct. 1981, pp. 2294–2296.
"Digital Phase-Locked Loops Move into Analog Territory"–Greer, Jr. et al., Electronic Design, Mar. 31, 1982, pp. 95–100.

Primary Examiner—Eugene R. LaRoche
Assistant Examiner—Robert J. Pascal
Attorney, Agent, or Firm—Norman R. Bardales

[57] ABSTRACT

A phase lock loop oscillator is provided with a voltage controlled oscillator which includes a current controlled oscillator and an input controller therefor that maintains the center frequency of the current controlled oscillator substantially constant irrespective of changes in the gain of the voltage controlled oscillator.

12 Claims, 7 Drawing Figures

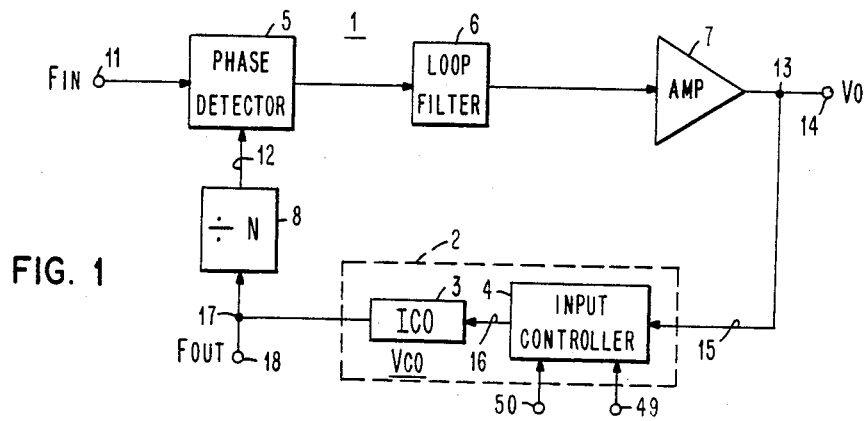
FIG. 1
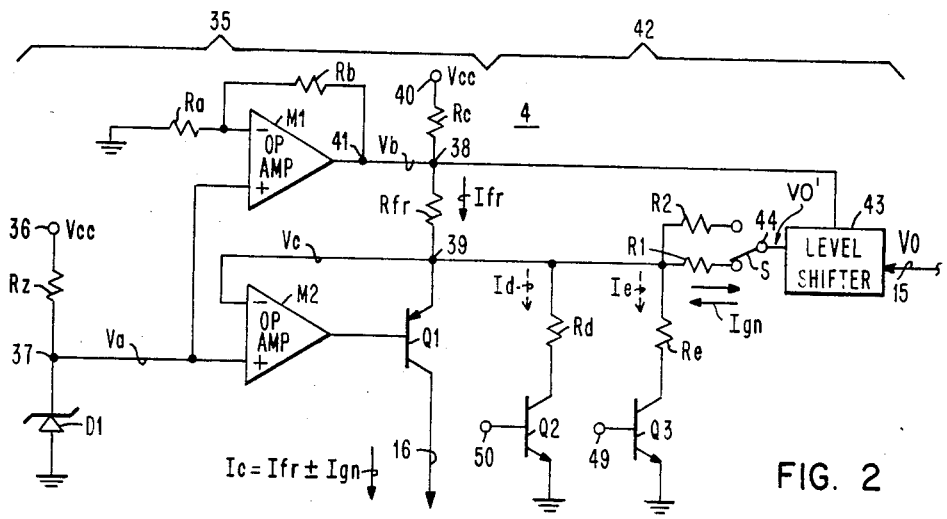
FIG. 2
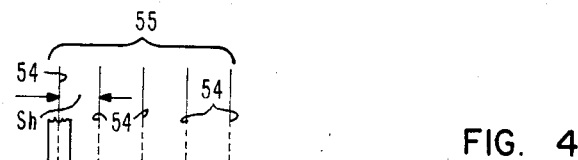
FIG. 4
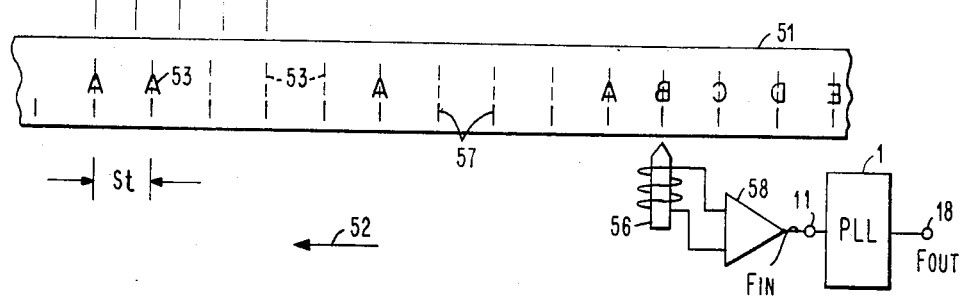

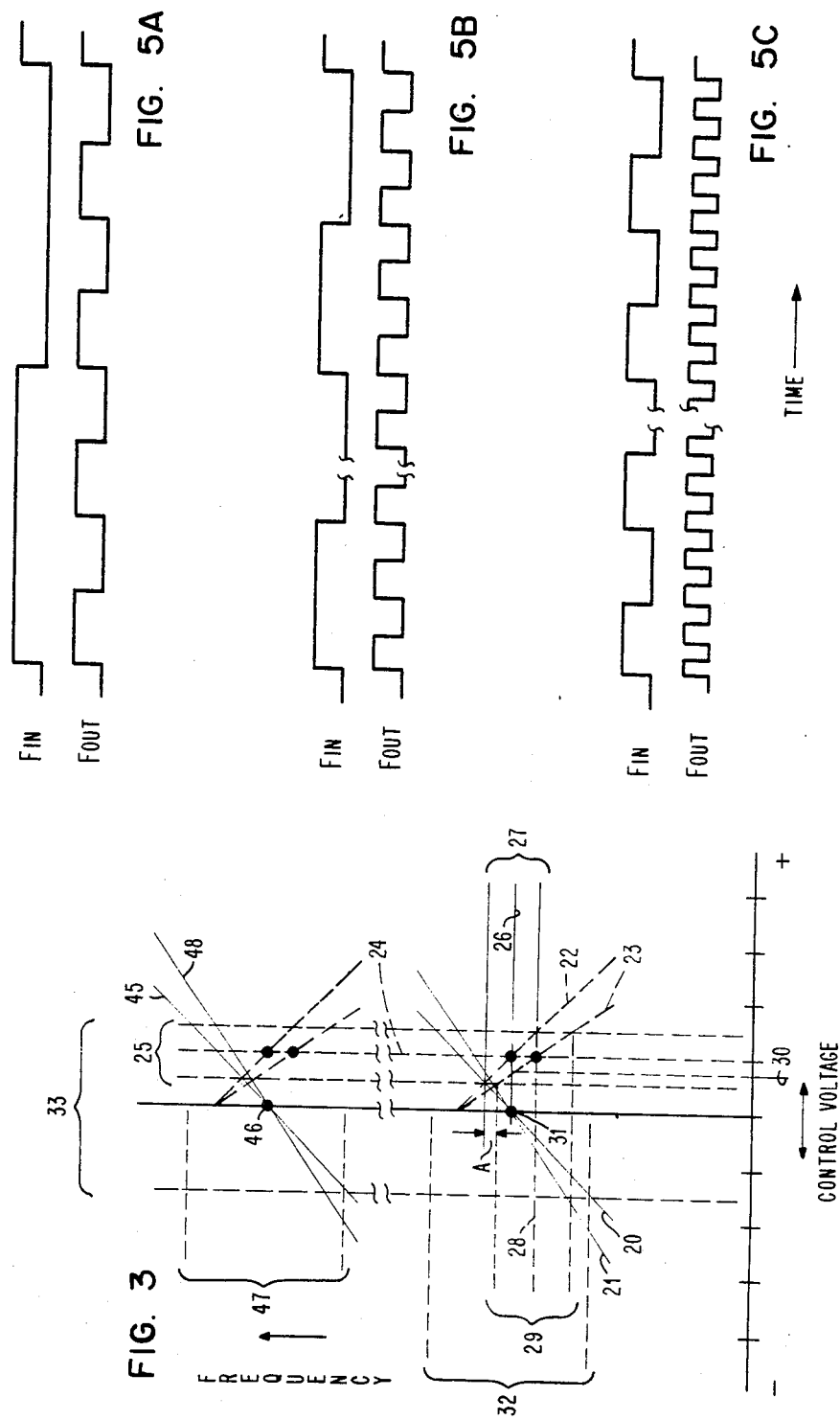

INPUT CONTROLLER CIRCUIT APPARATUS FOR PHASE LOCK LOOP VOLTAGE CONTROLLED OSCILLATOR

CROSS REFERENCE TO RELATED APPLICATION

In copending patent application, Ser. No. 321,508, filed Nov. 11, 1981, now U.S. Pat. No. 4,494,080, issued Jan. 15, 1985, entitled "Voltage-Controlled Oscillator", M. G. Call and assigned to the common assignee herein, there is described a phase lock loop voltage controlled oscillator of the type having an input controller and current controlled oscillator. In copending patent application, Ser. No. 391,313, filed June 23, 1982, now U.S. Pat. No. 4,425,844 issued Jan. 17, 1984 entitled "Home Pulse Compensation For Multiple Speed Line Printer", J. E. Carrington et al and assigned to the common assignee herein, there is described a high multispeed on-the-fly impact line printer apparatus for which the present invention is particularly useful but is not necessarily limited thereto.

BACKGROUND OF THE INVENTION

1. Field of the Invention

This invention relates to phase lock loop systems and more particularly to voltage controlled oscillators thereof of the type having an input controller.

2. Description of the Prior Art

It is known to use phase lock loops (PLLs), also referred to in the art as phase locked loops, for various applications. One such application is to use a PLL as a frequency multiplier. For example, the multiple high speed on-the-fly impact line printer apparatus described in the aforementioned Carrington et al patent, which is incorporated herein by reference, employs a PLL as a frequency multiplier in the print hammer control system to generate the subscan pulses from the scan pulses used in the system. In the Carrington et al application, the aforementioned PLL is referred to therein as a phase lock loop oscillator circuit. The circuit is designated therein with the reference numeral 22 and shown schematically in block form in the accompanying drawing thereof.

The PLL oscillator circuit converts the printer scan pulses to the required number of subscan pulses which are used in the operation of the printer apparatus in accordance with the scan/subscan principle of operation well known to those skilled in the art. The principle is based on the pitch differential between the print hammer spacing and the type element spacing, cf. U.S. Pat. No. 4,275,653, also incorporated by reference herein. As such, each scan pulse is converted into a number of subscan pulses that is a fixed multiple correlated with the particular pitch differential. For the pitch differential example given in the Carrington et al application, the PLL generates subscan pulses at the rate of four subscan pulses per scan pulse. This rate of conversion is constant regardless of the speed of the printer type element band. However, while the rate is constant, the scan frequency, i.e number of scan pulses per second, is dependent on the speed of the type element band. Thus, the subscan pulses are generated by the PLL oscillator circuit at subscan frequency, i.e. the number of subscan pulses per second, which is equivalent to the product of the aforementioned multiple and scan frequency.

A PLL voltage control oscillator (VCO) circuit is described in the aforementioned Call patent, which is also incorporated by reference herein. The VCO of the Call PLL includes a current controlled oscillator (ICO) and an input controller coupled in series to the ICO. The ICO is substantially identical to a conventional VCO except that it is controlled by current instead of by voltage as is done in conventional VCOs. Accordingly, whereas in a conventional PLL the error voltage is fed directly into the VCO, in the Call PLL the error voltage is processed by the input controller prior to its application to the ICO. For sake of explanation and clarity, some of the Call patent elements discussed hereinafter are also sometimes herein identified parenthetically with their corresponding reference characters as used in the Call patent so as to distinguish them from the reference characters of the present application.

The input controller of Call includes two current mirrors (designated therein by the respective reference numerals 56 and 64) which provide respective output currents (designated therein as Ifr and Igain, respectively). The output current (Ifr) from the one current mirror (56) sets a frequency referred to therein as the free-run center, i.e. midpoint, frequency of the ICO. The output current from the other current mirror (64) sets the desired gain Kv of the ICO. The current mirrors (56, 64) are connected to external circuits (designated therein by the respective reference numerals 54 and 60) and each of which allows the output current of the particular current mirror to which it is connected to be adjusted.

The external circuit (54), which is associated with the current mirror (56) that provides the output current (Ifr), includes two mutually exclusive reference sources, one of which is a resistor coupled to ground or other reference potential, and the other of which is a current source. One of the two sources is selectively coupled to one of the two legs of the current mirror (56), the other leg of which provides the aforementioned output current (Ifr) and is the output leg of the current mirror (56).

The external circuit (60), which is associated with the other current mirror (64), has a similar configuration. It includes two mutually exclusive reference sources, one of which is a resistor coupled to the error voltage (Vo) terminal of the associated PLL or a voltage (Vin) derived therefrom, and the other of which is coupled to a current source (Iin) which is a function of the PLL error voltage. One of the two sources is selectively coupled to one of the two legs of the current mirror (64), the other leg of which provides the aforementioned output current (Igain) and is the output leg of the current mirror (64).

The two current mirrors (56, 64) are configured in a summing difference mode. More specifically, the transistors of the current mirror (56), which produces the output current (Ifr), are of one type and the transistors of the other current mirror (64) are of the complementary type. In the preferred embodiment, the transistors of current mirror (56) are PNPs and those of current mirror (64) are NPNs. The respective output legs of the current mirrors are connected at a summing difference node (designated therein by the reference number 66), which in turn is connected to the ICO so as to adjust independently the gain and free-run frequency of the ICO. More specifically, with this configuration, the current (Ifr) flows toward the node (66) and the current (Igain) flows away from node (66) and the resultant control current (Ifr - Igain), i.e. Ifr minus Igain, flows in a direction away from node (66) and towards the ICO.

It was found that the Call PLL had certain characteristics that were not amenable or desirable for its direct implementation in certain applications where the error voltage must be adjusted by the PLL to maintain the same and/or precise ICO frequency, such as in certain frequency tracking applications, for example. For one thing, when the error voltage (Vo) of the Call PLL is at its median voltage, the VCO and more particularly the ICO thereof oscillates at its center frequency (Ffr). As a result, any change in gain causes a shift in the center frequency error voltage (Vo) in the PLL in order to maintain the same ICO center frequency in the PLL resulting in a non-symmetric frequency range control which adversely affects the operation of the PLL for these particular type of applications. This is particularly true in the case of the aforedescribed Carrington et al multispeed printer apparatus. Since each individual speed used by the printer is correlated with a particular center frequency of the VCO, any undesired shift in the center frequency error voltage in the PLL in order to maintain the same center frequency results in a non-symmetric frequency range about the desired center frequency resulting in an asymmetric frequency range control that adversely affects the generation of the subscan pulses and therefore the operation of the printer. Because of these and other characteristics, the Call PLL is hence not conducive for direct implementation in certain applications such as, for example, the multispeed printer apparatus of Carrington et al, and would require extensive modification to make it amenable for such applications thereby increasing the circuit complexity and cost.

SUMMARY OF THE INVENTION

It is an object of this invention to provide a VCO with an improved center frequency vs control voltage characteristic.

It is another object of this invention to provide a VCO of the type having an ICO and input controller therefor which does not substantially shift its center frequency when changing the gain thereof.

Still another object of this invention is to provide a PLL VCO as a frequency multiplier which has selectable multiple center frequencies, each of which remains substantially constant irrespective of the change in gain thereof, and/or which frequency multiplier converts the scan pulses to subscan pulses in a multiple high speed on-the-fly impact line printer.

Still other objects of this invention are to provide a PLL and VCO thereof of the type having an input controller and ICO that is relatively simple and inexpensive, has more reliable gain and center frequency control, and/or is insensitive to power supply variations.

According to one aspect of the present invention, there is provided voltage control oscillator circuit apparatus having a current controlled oscillator with first input means and first output means, respectively. The voltage control oscillator circuit apparatus also has input controller means having second input means and second output means, respectively. A control input voltage signal is applied to the second input means, and the input controller means provides a control current at the second output means to the first input means of the current controlled oscillator that maintains the center frequency of the current controlled oscillator substantially constant irrespective of changes in the gain of the voltage controlled oscillator.

The foregoing and other objects, features and advantages of the invention will be apparent from the more particular description of the preferred embodiments of the invention, as illustrated in the accompanying drawing.

BRIEF DESCRIPTION OF THE DRAWING

FIG. 1 is a schematic diagram shown in block form illustrating the preferred embodiment of phase lock loop of the present invention;

FIG. 2 is a schematic diagram of a preferred embodiment of the input controller circuit apparatus of FIG. 1;

FIG. 3 is an idealized waveform diagram of the frequency vs gain characteristic of the voltage control oscillator of FIG. 1;

FIG. 4 is a partial schematic diagram of a high multiple speed impact line printer apparatus utilizing the PLL of FIG. 1 as a frequency multiplier to generate the subscan pulses thereof; and FIGS. 5A-5C are idealized waveform diagrams of various scan and subscan pulses associated with the PLL used by the printer apparatus of FIG. 4.

In the figures, like elements are designated with similar reference numbers.

DESCRIPTION OF THE PREFERRED EMBODIMENTS

Referring to FIG. 1, there is shown in block form a PLL, generally indicated by the reference number 1, and a VCO 2, which are preferred embodiments of the PLL and VCO thereof of the present invention. VCO 2 has an ICO 3 and an improved input controller 4 of the present invention hereinafter described in greater detail with reference to FIG. 2. The conventional elements of PLL 1 are phase detector 5, i.e. phase comparator, loop filter 6, amplifier 7 and frequency divider 8 that is part of the PLL feedback circuit that includes VCO 2.

A recurring input signal Fin is applied to an input 11 of comparator 5, the other input 12 of which is coupled to the output of divider 8. Comparator 5 provides an error signal at its output which is proportional to the phase difference between the input signal Fin and the output signal of divider 8. The error signal is fed to loop filter 6 which removes any unwanted frequency from the error signal. The filtered signal is applied to amplifier 7, which in response provides an error control signal V0 at node 13. Node 13 is connected to error signal output access terminal 14 and to the input of the aforementioned PLL feedback circuit and more particularly to the input 15 of the input controller 4 of VCO 2. Output 16 of controller 4 is connected to the input of ICO 3 which has circuitry substantially similar to conventional voltage controlled oscillators but uses an input current for its control instead of a voltage. The ICO described in the aforementioned copending Call application, as well as the circuits for the VCOs described in U.S. Pat. No. 3,904,988 and the IBM Technical Disclosure Bulletin Vol. 13, No. 8, January 1971, pages 2170-2171, both of which are incorporated by reference therein and likewise incorporated herein by reference, are but three examples of the circuits that can be employed for the ICO 3. Accordingly, the details of ICO 3 are omitted herein for sake of clarity. The output of ICO 3 is connected to node 17 which in turn is connected to the input of divider 8 thereby closing the loop of PLL 1. An output terminal 18 is also connected to the output of ICO 3.

In operation, the error control signal V0 is processed by controller 4 so as to provide a current control signal for the ICO 3. As a result, the VCO 2 generates an output signal Fout which has a frequency which is a multiple N of the frequency of the input signal Fin. The output signal Fout is applied to divider 8 which converts signal Fout back to the frequency of the input signal Fin thereby closing the loop and allowing the converted signal Fout and the input signal Fin to be processed in PLL 1 in a phase locked relationship well known to those skilled in the art. In this phase locked relationship, the signals Fin and converted Fout are maintained in phase, i.e. the converted signal Fout tracks the signal Fin, by the error voltage or signal V0. In certain applications, such as certain frequency multipliers for example, it is desirable that the error signal adjust the frequency of the ICO 3 so that the frequency of Fout and more particularly the converted resultant frequency from divider 8 allows the converted output signal Fout to track the input signal Fin.

Heretofore in the prior art PLLs of which we are aware, the VCO or ICO frequency versus the error control voltage characteristic was symmetrical about the aforementioned center frequency of a given frequency range for a fixed VCO or ICO gain, the given frequency range being correlated with the predetermined frequency changes expected for the input signal being tracked. However, in these prior art PLLs, if the gain were to change, either intentionally or non-intentionally, the center frequency of the VCO or ICO would shift causing a corresponding shift in the frequency range for the same control voltage range thereby adversely effecting the ability of the PLL to track the incoming signal for the aforementioned expected frequency changes thereof.

Now in accordance with the principles of the present invention, the improved VCO 2 of the present invention has a frequency versus control voltage characteristic whereby the input controller 4 thereof provides a control current at its output 16 to the input of the ICO 3 that maintains the center frequency of the ICO 3 substantially constant irrespective of changes in the gain of the ICO 3. As a result, PLL 1 is not only able to track the incoming signal within its expected frequency changes in a more reliable manner, it is also able to do so with high fidelity as will become apparent from the discussion of the waveforms of FIG. 3, which next follows.

Referring to FIG. 3, the waveforms associated with the VCO 2 of the present invention are shown in solid line form, e.g. waveforms 20 and 21, and for purposes of comparison those of the VCO described in the aforementioned Call copending application are shown in dash line form, e.g. waveforms 22 and 23. Waveform 22 represents the frequency versus control characteristic of the Call VCO for a given nominal gain m1. It has a median voltage indicated by the vertical intercept 24 which is in the control voltage range 25 for which the PLL circuitry is designed. Accordingly, the Call VCO has a center frequency indicated by the horizontal intercept 26 and operates in the frequency range 27, which is correlated with the predetermined frequency change range expected for the input signal being tracked by the Call PLL. Thus, assuming no change in gain, if and/or when a frequency change occurs in the input signal to the Call PLL within the expected change range, the error voltage changes in the appropriate direction from its median level 24, which is associated with the center frequency 26, to a new level which adjusts the frequency of the ICO to the appropriate frequency within the range 27 as dictated by the slope of the waveform 22 thereby allowing the PLL to track the new frequency of the input signal.

Waveform 23 represents the frequency versus control characteristic of the Call VCO for a gain m2 caused by an assumed gain change from the nominal gain m1. As can be seen in FIG. 3, for the same control voltage range 25, the center frequency shifts to a lower level 28 from the previous center frequency 26 and there is a corresponding shift from the frequency range 27 to a new range 29. As such, a part A of the range 27 is not covered because of the gain change and hence the PLL cannot track those frequencies of the incoming signal which are correlated with part A when operating with the characteristic 23. Moreover, if it were desired to maintain the VCO at the same frequency as the center frequency 26 of its nominal gain m1 when the gain changes to m2, then the control voltage has also to be shifted as indicated by the vertical intercept 30 with the waveform 23 and thereby is asymmetrically positioned in the given voltage range 25, as well as frequency range 29. Hence, the Call PLL has to be operated with very limited gain tolerance and/or is unreliable in the fidelity with which it can track the incoming signal frequency.

By way of comparison, waveform 20 represents the frequency vs control voltage characteristic of VCO 2 at some nominal gain comparable to the aforementioned gain m1, and waveform 21 represents the frequency vs control voltage characteristic at another gain comparable to the aforementioned gain m2. For sake of comparison, the VCO 2 is assumed to have a nominal center frequency substantially equal to the nominal frequency 26 of the Call VCO, as indicated by the intersection 31 of the extension of horizontal intercept 26 and the waveform 20. The center frequency 31 of VCO 2 and in particular of the ICO 3 thereof remains substantially constant and remains centered in the same frequency range 32 for a given control voltage range 33 irrespective of any changes in gain as shown by the waveforms 20 and 21 in FIG. 3. As a result, PLL 1 is more tolerant of gain changes, and has the capability of an increased control voltage range and/or increased frequency range for its VCO 2, not heretofore available in the prior art. PLL 1 is thus able to track the frequency of the incoming signal with a high degree of fidelity.

Referring now to FIG. 2, there is shown a preferred embodiment of the current controller 4 of the present invention which allows the VCO 2 of which it is a part to have the improved frequency versus control voltage characteristic. More particularly, it provides a control current Ic at its output 16 to the input of the ICO 3 that maintains the center frequency of the ICO 3 substantially constant irrespective of changes in the gain of the ICO 3. For sake of explanation, it will be assumed that ICO 3 is configured identical to the ICO described in the Call patent and as such includes an oscillatory capacitor, and two transistors configured as a current mirror which drives the capacitor, together with the other components thereof, which include those of a conventional oscillator. The details of ICO 3 are hence not shown herein for sake of simplicity, the operation of such ICOs being well known to those skilled in the art. Suffice it to say that the control current Ic at the control output 16 of controller 4 is fed to the last mentioned current mirror of ICO 3 that in turn controls the charge/discharge cycle of the oscillatory capacitor and hence the output frequency of the ICO 3.

As shown in FIG. 2, controller 4 includes a current source, which is generally indicated by the reference number 35. The current source 35 includes a zener diode reference source D1 connected to power supply terminal 36 through resistor Rz. Diode source D1 establishes a reference potential Va at node 37. A pair of operational amplifiers M1 and M2, which are also part of current source 35, have their non-inverting inputs (+) commonly connected to zener diode reference source D1 at node 37. Amplifier M1 is configured as a non-inverting voltage amplifier stage with a gain greater than one. Amplifier M2 in coaction with normally conducting transistor Q1 is configured as a unity gain voltage follower stage. The non-inverting voltage amplifier stage M1 establishes a reference voltage Vb at node 38, where Vb=KVa, K being the gain factor associated with amplifier M1 which is a constant greater than one, i.e. greater than unity gain. On the other hand, the unity gain voltage follower stage M2-Q1 establishes a reference voltage Vc at node 39, where Vc=Va. As a result, a fixed reference current Ifr flows through the resistor Rfr which is independent of variations in the power supply voltage Vcc. The fixed reference current Ifr is correlated with the desired nominal center frequency of ICO 3 and hence VCO 2, and is the unilateral current component provided by current source 35 to the control current Ic at output 16 of controller 4. As such, the current Ifr is substantially constant, i.e. fixed.

As is sometimes customary with the operation of operational amplifiers, it is often desirous and preferable that the amplifier be operated so that its output current flows in a predetermined unilateral direction, i.e. so that it either sinks or sources the output current. Accordingly, it should be understood that the power supply voltage Vcc at power supply terminal 40 through resistor Rc causes operational amplifier M1 either to sink current away from node 38 and toward its feedback node 41, or in the alternative to source current away from its feedback node 41 toward node 38. In either case, as is obvious to those skilled in the art, the reference voltage Vb is maintained at node 38. In the preferred embodiment, operational amplifier M1 sinks its output current.

Controller 4 has another current source, generally indicated by the reference number 42. In response to the variable error voltage V0 applied to input 15, current source 42 provides a proportional bidirectional current Ign to node 39 that is algebraically added thereat to the current Ifr of source 35, and the resultant current $Ic = Ifr \pm Ign$ is fed commonly through transistor Q1 to output 16.

Current source 42, if desired, has a level shifter 43 that converts the voltage level of the error voltage V0 applied to input 15 to a level compatible to the particular circuit technology and/or configuration used to implement PLL 1. Shifter 43 is connected to an appropriate power supply terminal, e.g. terminal 40 via node 38 and resistor Rc as shown in FIG. 2, and its output 44 is coupled to node 39 by circuit means which includes a resistor, e.g. resistor R1, that has a resistance value correlated with the desired nominal gain for VCO 2 and hence ICO 3. If desired, one or more selectively connectable additional resistors, e.g. resistor R2, can be connected to the output of shifter 43 by appropriate electronic switching means, shown schematically by the switch S in FIG. 2 for sake of explanation, so as to provide VCO 2 and/or ICO 3 with an adjustable gain capability. One or more additional transistor switches, i.e. transistors Q2 and Q3, that are normally non-conductive, are preferably provided to allow operation of VCO 2 and/or ICO 3 at one or more different nominal center frequencies as will be discussed hereinafter.

In operation, the VCO 2 is set to some predetermined gain by positioning switch S to select an appropriate one of the resistors R1 and R2. It is assumed for purposes of explanation, that switch S is positioned to connect resistor R1 into the circuitry of source 42 and switches Q2 and Q3 are open, when VCO 2 is operating with the frequency versus control voltage characteristic waveform 45 of FIG. 3. As such, any change in the error signal V0 due to a frequency change in the input signal Fin causes the output signal Fout to shift from its nominal center frequency 46 in the appropriate direction to the frequency within the frequency range 47 as dictated by the slope of waveform 45, thus allowing PLL 1 to track the frequency of the input signal Fin as previously explained. Again, if the gain of VCO 2 should change, either intentionally as might be the case where another gain resistor such as resistor R2 is selected or unintentionally as might be the case due to allowable tolerances, the nominal frequency 46 remains the same, waveform 48 being indicative of the frequency vs control voltage characteristic of the VCO 2 for an assumed gain change from the nominal gain associated with waveform 45.

With only transistor Q1 conducting, i.e. transistors Q2 and Q3 are not conducting, VCO 2 operates in a relatively high frequency range 47, FIG. 3. To operate at the lower frequency range 32, a control signal is applied to the control terminal 49 of transistor Q3 causing it to also be conductive, it being understood that transistor Q2 remains non-conductive. As a result, a part Ie of the current Ic as determined by current limiting resistor Re is shunted through Q3 so that the remainder of the current Ic causes VCO 2 and/or ICO 3 to operate in the relatively lower frequency range 32. Thus for a given gain, the slope of the frequency vs control voltage waveform remains the same and the control voltage range 33 remains the same whenever the frequency range is reset as can be seen from the waveforms 20 and 45 of FIG. 3. It should be understood that the waveforms 20 and 45 of FIG. 3 are plotted for one nominal gain and hence have identical slopes; and that waveforms 21 and 48 are plotted for another different gain which result from equivalent changes from the nominal gain associated with waveforms 20 and 45. It can be shown that similar results are obtained for an intermediate frequency range, not shown, when transistor Q2 is made conductive by an appropriate control signal applied to its control terminal 50 and transistor Q3 is not conducting. In this last mentioned case, a part Id of the current Ic as determined by current limiting resistor Rd is shunted through Q2 so that the remainder of the current Ic causes VCO 2 and/or ICO 3 to operate in the aforementioned intermediate frequency range, not shown.

The inter-relationship of the currents can be obtained by well known circuit analysis principles. Briefly, the gain K of amplifier stage M1 is defined as:

$$K = 1 + Rb/Ra, \tag{1}$$

and thus the voltage Vb at node 38 is:

$$Vb = Va(K) = Va(1 + Rb/Ra). \quad (2)$$

For the unity gain follower stage M2-Q1, the voltage Vc at node 39 is:

$$Vc = Va, \quad (3)$$

and the current Ifr through resistor Rfr as derived from equations (1) through (3) is:

$$Ifr = (Vb - Vc)/Rfr = VaRb/RaRfr. \quad (4)$$

As can be noted from equation (4), Ifr is fixed and independent of the power supply voltage Vcc. The current Ifr of equation (4), it should be understood, sets the center frequency 46 of the high frequency range 47, FIG. 3. The current Ifr is modified to set the respective center frequency of the mid-frequency range and low frequency range 32 by turning on transistors Q2 and Q3, respectively, in the manner previously described. The resulting modified currents Ifr' and Ifr'' for setting the center frequency of the mid-frequency range and the center frequency 32 of the low frequency range 32 are given respectively by equations (5) and (6), as follows:

$$Ifr' = Ifr - Id = (VaRb/RaRfr) - Va/Rd, \quad (5)$$

and $$Ifr'' = Ifr - Ie = (VaRb/RaRfr) - Va/Re. \quad (6)$$

The center frequency for each of the three frequency ranges occurs when the control voltage V0 is at its null which after being shifted in shifter 43 results in an output signal V0' that equals Vc, i.e. has the following relationship:

$$V0' = Vc = Va. \quad (7)$$

The current Ign provided by current source 42 is governed by the relationship:

$$Ign = (V0' - Va)/Rgn, \quad (8)$$

where Rgn is the resistance value of the resistor selected to set the the nominal gain for the VCO 2, e.g. Rgn=R1. For the condition of equation (7), to wit: V0 is at its null, Ign is:

$$Ign = 0. \quad (9)$$

Hence, whenever V0' is greater than Va, Ign adds to Ifr at node 39; and whenever it is less than Va, Ign subtracts from Ifr at node 39. Accordingly, when resistor R1 is selected as the gain resistor Rgn, the control current Ic for the high, middle and low frequency ranges are expressed by equations (10), (11) and (12), respectively, as follows:

$$Ic = Ifr \pm Ign \quad (10)$$
$$= (VaRb/RaRfr) \pm (V0' - Va)/R1,$$
$$Ic = Ifr - Id \pm Ign \quad (11)$$
$$= (VaRb/RaRfr) - Va/Rd \pm (V0' - Va)/R1, \text{ and}$$
$$Ic = Ifr - Ie \pm Ign \quad (12)$$
$$= (VaRb/RaRfr) - Va/Re \pm (V0' - Va)/R1.$$

Thus, in each of the three frequency ranges, the respective center frequency thereof remains constant irrespective of changes in the gain thereby allowing the PLL 1 to track the incoming signal Fin with high fidelity in each range. Moreover, switching from one frequency range to another, the slope of the corresponding frequency vs control voltage waveform remains the same as does the control voltage range.

These characteristics make PLL 1 particularly useful for multiple high speed on-the-fly impact line printer apparatus such as, for example, the one described in the aforementioned Carrington et al patent and herein only partially shown in FIG. 4 for sake of explanation. In accordance with the principles of the present invention, the PLL 1 is used as a frequency multiplier to convert the scan pulses to subscan pulses used in the control system described therein for firing the associated print hammers at the appropriate times and/or other purposes. Thus as shown in FIG. 4, a continuous type element band 51, which moves in the direction 52, carries a plural number of uniformly spaced type elements, only some of which are shown for sake of clarity, as represented by their center lines 53. The band 51 carries the elements 53 past a row of plural uniformly spaced print hammers, only one of which is shown and some others of which are represented by their respective center lines 54. The examples given in the Carrington et al patent are one hundred and sixty-eight print hammers 54 in the row and a corresponding number of print positions of a print line, and four hundred and eighty type elements 53 on the band 51.

A pitch differential occurs due to the difference in the type element spacing St and the hammer spacing Sh. For the example given in the Carrington et al patent of ten print hammers to the inch, i.e. Sh=0.100 in., and type element spacing St=0.133 in., in a given span 55, there are five hammers and four type elements. Because of this pitch differential, four subscan pulses are required for each scan pulse as explained in the aforementioned Carrington et al patent. The scan pulses are generated by the transducer 56 which is positioned adjacent to the band 51 in advance of the row of hammers and senses the timing markings 57, each of which is associated with one of the type elements 53 and is carried in alignment therewith on band 51. The scan pulses are fed via amplifier 58 to the input 11 of PLL 1 which converts them to the subscan pulses at terminal 18 where they are processed by the remainder, not shown, of the Carrington et al control system, the details of which are herein omitted for sake of clarity. Further information as to the processing of the subscan pulses and the aforementioned print hammer control system can be obtained from the Carrington et al patent, which as aforementioned is incorporated by reference herein.

For the pitch differential example given in the Carrington et al patent, the rate of conversion of scan pulses to subscan pulses is a multiple N=4. PLL 1 thus generates subscan pulses in the signal Fout at the rate of four subscan pulses for each scan pulse of the input signal Fin. This rate of conversion is constant regardless of the speed of the printer type element band 51. However, while the rate is constant, the scan frequency, i.e number of scan pulses per second, is dependent on the speed of the type element band 51. Correspondingly, for the given example of four subscan pulses per scan pulse, a divide factor is used in divider 8 equal to the multiple N=4 so as to allow PLL 1 to track the scan pulse frequency.

In operation, the three nominal center frequencies of the VCO 2 which are associated with the high, mid and low frequency ranges are correlated with the high, mid and low selectable nominal speeds at which the band 51 will operate. Typical nominal operating speed modes for band 51 are 1000, 666 and 333 inches per second. FIGS. 5A–5C illustrate the waveforms for the signal Fin, i.e. scan pulse frequency, and resultant signal Fout, i.e. subscan pulse frequency, when the band 51 is operated at the low, mid and high nominal speeds, respectively. The frequency of the output signal Fout is thus the product of the aforementioned multiple N and the frequency of the input signal Fin. Once an operational speed mode is selected, it is important that the PLL 1 track any changes in speed of the belt 51 caused by the inherent operational characteristics of the printer apparatus and do so in an accurate manner to insure proper firing of the opted hammers at the appropriate times as the particular type elements to be printed become aligned therewith. The PLL 1 of the present invention allows the subscan pulse frequency to accurately track the scan frequency and maintain the center frequency constant irrespective of any changes in gain of the VCO 2.

It should be understood that while the PLL 1 is particularly useful for the aforedescribed multiple high speed printer apparatus, it is not intended to be limited thereto. Moreover, it should be understood that while the input controller 4 is preferably used to provide a control current which has an operating point independent of gain to control an ICO, it is not intended to be limited thereto but can be used for other control current applications such as, for example, servoloop feedback applications. Also, as is apparent to those skilled in the art, the PLL 1 can be configured to operate with more or less frequency ranges than three, e.g. only one frequency range, and/or in the case of multiple frequency ranges, one or more of the ranges can overlap and need not be mutually exclusive as in the case of the preferred embodiments. Furthermore, while a particular ICO has been described for purposes of explanation in the preferred embodiment, it should be understood that other oscillator configurations may be employed in practicing the invention.

Thus, while the invention has been described with reference to preferred embodiments thereof, it will be understood by those skilled in the art that various changes in form and details may be made without departing from the scope of the invention.

We claim:

1. Voltage control oscillator circuit apparatus comprising:
   a current controlled oscillator having first input means and first output means, and
   input controller means having second input means and second output means, said second input means having a control input voltage signal applied thereto for controlling the oscillator frequency, said input controller means providing a control current at said second output means to said first input means of said current controlled oscillator, said control current having a bidirectional first component, said control current maintaining the nominal frequency of said current controlled oscillator substantially constant irrespective of changes in the gain of said voltage control oscillator circuit apparatus in response to said bidirectional component.

2. Voltage control oscillator circuit apparatus according to claim 1 wherein said input controller means further comprises:
   a first current source for providing said first component in response to said control input voltage signal applied to said second input means,
   a second current source for providing a unidirectional second component indicative of said nominal frequency, and
   algebraic summing means for summing said first and second current components to provide said control current.

3. Voltage control oscillator circuit apparatus according to claim 2 wherein said first current source further comprises:
   circuit means for setting the nominal gain of said voltage control oscillator circuit apparatus to a predetermined value.

4. Voltage control oscillator circuit apparatus comprising:
   a current controlled oscillator having first input means and first output means, and
   input controller menas having second input means and second output means, said second input means having a control input voltage signal applied thereto for controlling the oscillator frequency, said input collector means providing a control current at said second output means to said first input means of said current controlled oscillator, said control current having a bidirectional first component, said control current maintaining the nominal frequency of said current controlled oscillator substantially constant irrespective of changes in the gain of said voltage control oscillator circuit apparatus in response to said bidirectional component;
   said input controller means further comprising:
   a first current source for providing said first component in response to said control input voltage signal applied to said second input means,
   a second current source for providing a unidirectional second component indicative of said nominal frequency, and algebraic summing means for summing said first and second current components to provide said control current; and
   said second current source further comprising:
   a resistor,
   a non-inverting voltage amplifier stage having a gain greater than one,
   a unity gain voltage follower stage, said amplifier and follower stages having respective inputs and outputs, and a reference voltage source commonly connected to the inputs of said stages, said resistor being coupled between said outputs of said amplifier and follower stages and passing said second component therethrough,
   said amplifier stage, said follower stage, said resistor and said reference voltage source coacting to provide said second component.

5. Voltage control oscillator circuit apparatus comprising:
   a current controlled oscillator having first input means and first output means,
   input controller means having second input means and second output means, said second input means having a control input voltage signal applied thereto for controlling the oscillator frequency, said input controller means providing a control current at said second output means to said first input means of said current controlled oscillator, said control current having a bidirectional first component, said control current maintaining the nominal frequency of said current controlled oscillator substantially constant irrespective of changes in the gain of said voltage control oscillator circuit apparatus in response to said bidirectional component, and selectable switching means for switching some of said control current from said second output means to provide selectively at least one other nominal frequency for said voltage control oscillator circuit apparatus, said input controller means further comprising:
   a first current source for providing said first component in response to said control input voltage signal applied to said second input means,
   a second current source for providing a unidirectional second component indicative of said nominal frequency, and algebraic summing means for summing said first and second current components to provide said control current.

6. Phase lock loop circuit apparatus having an output signal for tracking and locking onto the frequency of an input signal to said phase lock loop circuit apparatus, said phase lock loop circuit apparatus comprising:

phase comparator means for comparing said input signal and said output signal to provide a correction voltage signal indicative of the phase difference between said input signal and said output signal, and phase changing means responsive to said correction voltage signal for changing the phase of said output signal to effect said tracking and locking onto the frequency of said input signal, said phase changing means comprising a voltage control oscillator circuit having a current controlled oscillator and input controller means for controlling said current controlled oscillator, said current controlled oscillator having first input means and first output means, said current controlled oscillator providing an oscillator signal at said first output means, and said input controller means having second input means and second output means, said second input means having said correction voltage signal applied thereto for controlling the oscillator frequency, said input controller means providing a control current at said second output means to said first input means of said current controlled oscillator, said control current having a bidirectional first component, said control current maintaining the center frequency of said current controlled oscillator substantially constant irrespective of changes in the gain of said voltage control oscillator circuit in response to said bidirectional component, said phase changing means further comprising output circuit means for providing said output signal in response to said oscillator signal.

7. Phase lock loop circuit apparatus according to claim 6 wherein said oscillator signal has a frequency which is a predetermined multiple of said input signal, and said output circuit means comprises a frequency divider for converting the frequency of said oscillator signal to the frequency of said input signal to provide said output signal with the frequency of said input signal.

8. Frequency multiplier circuit apparatus for converting scan pulses to subscan pulses for a control system of a high speed on-the-fly impact line printer having a scan/subscan operational mode, said frequency multiplier circuit apparatus comprising in combination phase comparator means and phase changing means arranged in a phase lock loop, said phase lock loop having an output signal for tracking and locking onto the frequency of said scan pulses, said phase comparator means comparing said scan pulses and said output signal to provide a correction voltage signal indicative of the phase difference between said scan pulses and said output signal, and said phase changing means in response to said correction voltage signal changing the phase of said output signal to effect said tracking and locking onto the frequency of said scan pulses, said phase changing means comprising a voltage control oscillator circuit having a current controlled oscillator and input controller means for controlling said current controlled oscillator, said current controlled oscillator having first input means and first output means, said current controlled oscillator providing at said first output means said subscan pulses with a predetermined frequency which is a predetermined multiple of said scan pulses, said input controller means having second input means and second output means, said second input means having said correction voltage signal applied thereto for controlling the oscillator frequency, said input controller means providing a control current at said second output means to said first input means of said current controlled oscillator, said control current having a bidirectional first component, said control current maintaining the center frequency of said current controlled oscillator substantially constant irrespective of changes in the gain of said voltage control oscillator circuit in response to said bidirectional component, said phase changing means further comprising a frequency divider for converting the frequency of said oscillator signal to the frequency of said scan pulses and to provide said output signal with the frequency of said input signal.

9. Voltage control oscillator circuit apparatus, for use in a phase lock loop having an output for providing a control input voltage signal, said apparatus comprising:

a current controlled oscillator having first input means and first output means, and input controller means having second input means, coupled to said output of said phase lock loop, and second output means, said second input means having said control input voltage signal applied thereto for controlling the oscillator frequency, said input controller means providing a control current at said second output means to said first input means of said current controlled oscillator, said control current having a bidirectional first component, said control current maintaining the center frequency of said current controlled oscillator substantially constant irrespective of changes in the gain of said voltage control oscillator circuit apparatus responsive to said bidirectional component.

10. Circuit apparatus according to claim 9 wherein said input controller means further comprises:

a first current source for providing said first component in response to said control input voltage signal applied to said second input means, a second current source for providing a unidirectional second component indicative of said center frequency, and algebraic summing means for summing said first and second current components to provide said control current.

11. Voltage control oscillator circuit apparatus, for use in a phase lock loop having an output for providing a control input voltage signal, said apparatus comprising:

a current controlled oscillator having first input means and first output means, and input controller means having second input means, coupled to said output of said phase lock loop, and second output means, said second input means having said control input voltage signal applied thereto for controlling the oscillator frequency, said input controller means providing a control current at said second output means to said first input means of said current controlled oscillator, said control current having a bidirectional first component, said control current maintaining the center frequency of said current controlled oscillator substantially constant irrespective of changes in the gain of said voltage control oscillator circuit apparatus responsive to said bidirectional current;

said input controller means further comprising:

a first current source for providing said first component in response to said control input voltage signal applied to said second input means, a second current source for providing a unidirectional second component indicative of said center frequency, and algebraic summing means for summing said first and second current components to provide said control current; and said first current source further comprises:

circuit means for setting the nominal gain of said voltage control oscillator circuit apparatus to a predetermined value; and said second current source further comprises:

a resistor, a non-inverting voltage amplifier stage having a gain greater than one, a unity gain voltage follower stage, said amplifier and follower stage having respective inputs and outputs, and a reference voltage source commonly connected to the inputs of said stages, said resistor being coupled between said outputs of said amplifier and follower stages and passing said second component therethrough, said amplifier stage, said follower stage, said resistor and said reference voltage source coating to provide said second component.

12. Circuit apparatus according to claim 11 further comprising:

selectable switching means for switching some of said control current from said second output means to provide selectively at least one other center frequency for said voltage control oscillator circuit apparatus.

* * * * *